US008384082B2

(12) United States Patent
Kim et al.

(10) Patent No.: US 8,384,082 B2
(45) Date of Patent: Feb. 26, 2013

(54) TRANSISTOR USING DERIVATIVE POLYMETHYL-METHACRYLATE THIN FILM AS GATE INSULATOR AND PASSIVATION LAYER, AND FABRICATION METHOD THEREOF

(75) Inventors: Il Doo Kim, Seoul (KR); Dong Hun Kim, Incheon (KR); Seung Hun Choi, Seoul (KR)

(73) Assignee: Korea Institute of Science and Technology (KR)

( * ) Notice: Subject to any disclaimer, the term of this patent is extended or adjusted under 35 U.S.C. 154(b) by 142 days.

(21) Appl. No.: 12/771,180

(22) Filed: Apr. 30, 2010

(65) Prior Publication Data

US 2011/0114953 A1 May 19, 2011

(30) Foreign Application Priority Data

Nov. 18, 2009 (KR) .................. 10-2009-0111596

(51) Int. Cl.
*H01L 29/786* (2006.01)
*H01L 21/44* (2006.01)

(52) U.S. Cl. ............. 257/57; 247/40; 247/59; 247/751; 247/E21.476; 247/E29.29; 438/158; 438/99; 438/780

(58) Field of Classification Search .......... 257/57, 257/E21.476, E29.29, 40, 59, 751, 310, 311; 438/158, 99, 780
See application file for complete search history.

(56) References Cited

U.S. PATENT DOCUMENTS

| 2006/0160284 A1* | 7/2006 | Fang et al. ............... 438/158 |
| 2007/0009386 A1* | 1/2007 | Padmanabhan et al. ... 422/68.1 |
| 2008/0102029 A1* | 5/2008 | Fritz et al. ............... 424/1.65 |
| 2010/0133516 A1* | 6/2010 | Lee et al. ................ 257/40 |

FOREIGN PATENT DOCUMENTS

KR 10-2008-0026990 3/2008

OTHER PUBLICATIONS

Cataract Refract Surg. Jul. 1992;18(4):395-401. in vitro evaluation of biocompatibility of surface-modified poly(methyl methacrylate) plate with rabbit lens epithelial cells. Ichijima H, Kobayashi H, Ikada Y.*

* cited by examiner

*Primary Examiner* — Cuong Q Nguyen
*Assistant Examiner* — Cathy N Lam
(74) *Attorney, Agent, or Firm* — Ostrolenk Faber LLP

(57) ABSTRACT

Disclosed are a transistor including a gate insulation layer and an organic passivation layer of a polymer thin film, and a fabrication method thereof. The transistor comprises a substrate, a gate electrode formed on the substrate, a gate insulation layer including a polymethacrylic acid thin film, formed on the gate electrode and the substrate, a channel layer formed on the gate insulation layer, source electrode and drain electrode formed on the channel layer so as to expose at least a part of the channel layer, and an organic passivation layer including a polymethacrylic acid thin film, formed on the source electrode, drain electrode and the partially exposed channel layer. The method for fabricating a transistor comprises steps of forming a gate electrode on a substrate, forming a gate insulation layer of a polymethacrylic acid thin film on the gate electrode and the substrate, forming a channel layer on the gate insulation layer, forming source electrode and drain electrode on the channel layer so as to expose at least a part of the channel layer, and forming an organic passivation layer of a polymethacrylic acid thin film on the source electrode, drain electrode and the partially exposed channel layer.

5 Claims, 8 Drawing Sheets

TRANSISTOR USING DERIVATIVE POLYMETHYL-METHACRYLATE THIN FILM AS GATE INSULATOR AND PASSIVATION LAYER, AND FABRICATION METHOD THEREOF

CROSS-REFERENCE TO A RELATED APPLICATION

Pursuant to 35 U.S.C. §119(a), this application claims the benefit of earlier filing date and right of priority to Korean Application 10-2009-0111596, filed on Nov. 18, 2009, the content of which is incorporated by reference herein in its entirety

BACKGROUND OF THE INVENTION

1. Field of the Invention

The present invention relates to a transistor, and particularly, to a is transistor using a derivative polymethyl-methacrylate thin film as a gate insulator and a passivation layer, and a fabrication method thereof.

2. Background of the Invention

Recently, research for utilizing an oxide thin film such as ZnO, $In_2O_3$, $SnO_2$, and $InGaZnO_4$ as a semiconductor channel layer of a transistor is being actively performed. Because of the excellent physical properties such as high ON/OFF ratio, high mobility, and excellent light transmittance (>80%), the oxide thin film is being actively applied to flexible electronic devices and transparent display devices.

However, the oxide semiconductor has a problem such that a semiconductor characteristic thereof easily becomes inferior to its initial value due to the external environmental factors such as contact with humidity, moisture and external gases. In order to solve this problem, what was conventionally used was a passivation layer formed by coating an inorganic passivation layer such as $SiO_2$, $SiN_x$ or $Al_2O_3$ on an upper layer of an oxide semiconductor thin film, or by coating aqueous polyvinyl alcohol (PVA) or an acrylate resin by spin coating, a solution process. However, it is difficult to directly apply the inorganic passivation layer onto a plastic substrate having a low glass transition temperature since the process is performed at a temperature higher than room temperature. Furthermore, when the organic passivation layer formed by the spin coating method has a thin thickness, pin holes may be formed or else its uniformity thereof may be degraded. The entire process becomes complicated, since a subsequent heat treatment process for evaporating a solvent is additionally required.

SUMMARY OF THE INVENTION

The object of the present invention is to provide a transistor capable of directly depositing a thin film on a plastic substrate having a low glass transition temperature, capable of providing an insulation film having a low leakage current characteristic, and capable of enhancing stability by using a derivative polymethyl-methacrylate thin film as a gate insulator and a passivation layer.

To achieve these and other advantages and in accordance with the purpose of the present invention, as embodied and broadly described herein, a transistor is provided, comprising of: a substrate; a gate electrode formed on the substrate; a gate insulation layer including a polymethacrylic acid thin film formed on the gate electrode and the substrate; a channel layer formed on the gate insulation layer; source electrode and drain electrode formed on the channel layer so as to expose at least a part of the channel layer; and an organic passivation layer including a polymethacrylic acid thin film, formed on the source electrode, drain electrode and the partially exposed channel layer.

And, to achieve these and other advantages and in accordance with the purpose of the present invention, as embodied and broadly described herein, a method for fabricating a transistor there is also provided, comprising of; forming a gate electrode on a substrate; forming a gate insulation layer of a polymethacrylic acid thin film on the gate electrode and the substrate; forming a channel layer on the gate insulation layer; forming source electrode and drain electrode on the channel layer so as to expose at least a part of the channel layer; and forming an organic passivation layer of a polymethacrylic acid thin film on the source electrode, drain electrode and the partially exposed channel layer.

The transistor according to the present invention may have the following advantages.

Firstly, since a derivative polymethyl-methacrylate (polymethacrylic acid) thin film is used as a gate insulator and a passivation layer, the transistor may have a prolonged lifespan due to its high stability.

Secondly, since the gate insulation layer and the organic passivation layer are formed by the sputtering method, the number of processes may be more reduced and a thin film having a higher density may be obtained when compared with the conventional spin coating method.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention; and taken together with the description serve to explain the principles of the invention.

In the drawings.

DETAILED DESCRIPTION OF THE INVENTION

Figure 1:
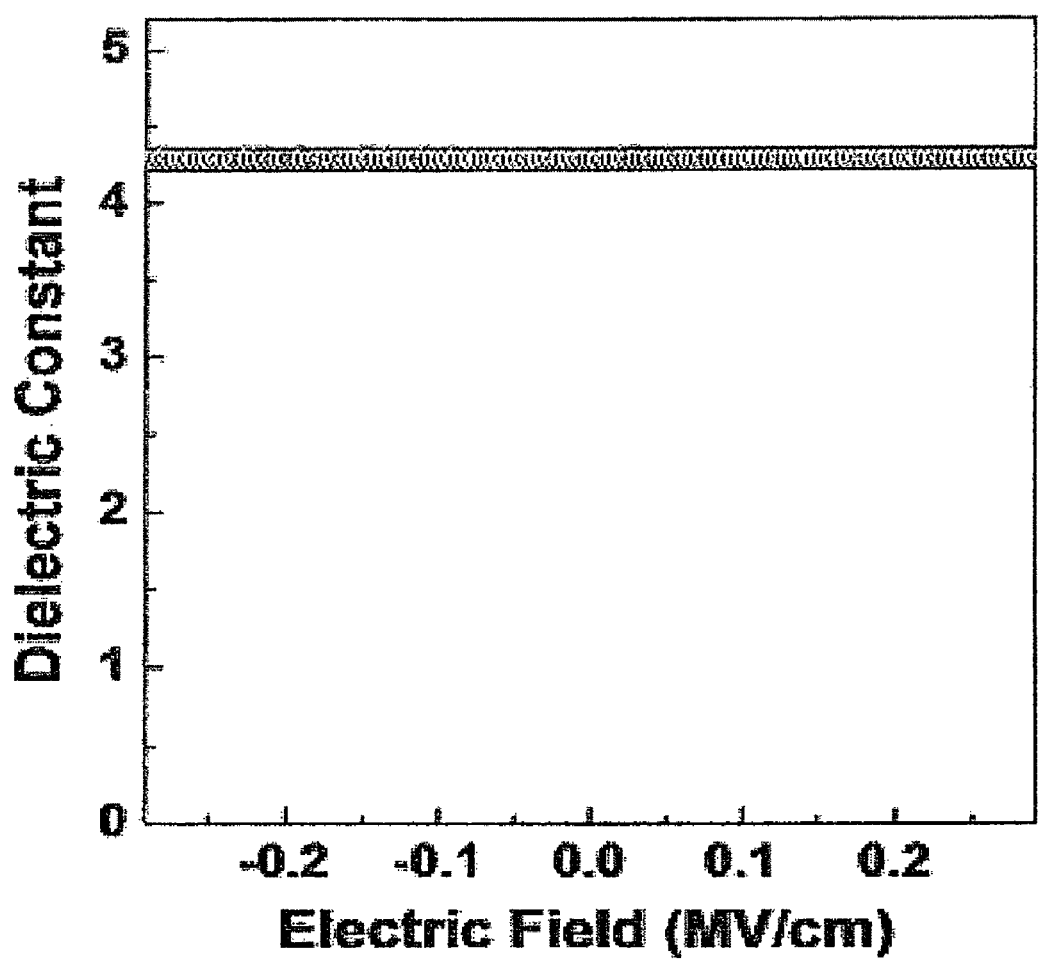
FIG. 1 is a graph showing the dielectric constant of a derivative polymethyl-methacrylate (polymethacrylic acid) thin film according to the present invention.

The following is the detail description of the present invention, with reference to the accompanying drawings.

Firstly a transistor according to the present invention will be explained in more detail.

The transistor according to the present invention includes a substrate, a gate electrode formed on the substrate, a gate insulation layer having a polymethacrylic acid thin film, formed on the gate electrode and the substrate, a channel layer formed on the gate insulation layer, source electrode and drain electrode formed on the channel layer so as to expose at least a part of the channel layer, and an organic passivation layer having a polymethacrylic acid thin film, formed on the source electrode, drain electrode and the partially exposed channel layer.

The polymethacrylic acid is a derivative of the polymethylmethacrylate.

The channel layer may be implemented as one of ZnO, $SnO_2$ and $In_2O_3$, or may be implemented as ZnO doped with In and Ga. Also, the substrate may be implemented as one of a plastic substrate, a glass substrate, and a silicon substrate doped with an insulation layer.

The transistor of the present invention may be implemented as a top gate type or a bottom gate type. And, the gate electrode, the source electrode, and the drain electrode may be formed by using one of Pt, Au, Pd, Cu, Ni, Cr, Mo, Al and transparent conductive oxides.

The gate insulation layer and the organic passivation layer may have high hydrophilicity because they are formed from a polymethacrylic acid thin film having a contact angle of 45° or less, and a polymethyl-methacrylate (polymethacrylic acid) thin film derivative having enhanced hydrophilicity may be formed as branches of polymethyl-methacrylate are transformed into carboxylic acid (—COOH) groups.

The gate insulation layer and the organic passivation layer may be a polymethacrylic acid thin film of high density, the thin film including no pores having a size greater than 20 nm, or may be a polymethacrylic acid thin film formed by being swollen by moisture. Preferably, the polymethacrylic acid thin film has a thickness range of 100-1200 nm.

Alternatively, the gate insulation layer and the organic passivation layer may include a polymethacrylic acid thin film of high density formed by sputtering the thin film having no pin holes and formed as carboxylic acid (—COOH) groups of polymethacrylic acid which are hydrogen-bonded to each other.

Next a method for fabricating a transistor according to the present invention will be explained.

The method for fabricating a transistor according to the present invention is comprised of forming a gate electrode on a substrate; forming a gate insulation layer of a polymethacrylic acid thin film on the gate electrode and the substrate; forming a channel layer on the gate insulation layer; forming source electrode and drain electrode on the channel layer so as to expose at least part of the channel layer; and forming an organic passivation layer of a polymethacrylic acid thin film on the source electrode, drain electrode and the partially exposed channel layer.

The polymethacrylic acid thin film which constitutes the gate insulation layer and the organic passivation layer may be a derivative thin film transformed from polymethyl-methacrylate.

The step of forming the gate insulation layer and the organic passivation layer may be a step of forming a derivative polymethyl-methacrylate (polymethacrylic acid) thin film having hydrophilicity more enhanced than that of polymethylmethacrylate, and having a contact angle of 45° or less.

Alternatively, the step of forming the gate insulation layer and the organic passivation layer may be a step of forming a polymethacrylic acid thin film so as to enhance hydrophilicity of the layers comprising the transistor, the thin film obtained as branches of polymethyl-methacrylate are transformed into carboxylic acid (—COON) groups and other hydrophilic groups.

Alternatively, the step of forming the gate insulation layer and the organic passivation layer may be replaced by a step of forming a polymethacrylic acid thin film of a high density, the thin film having no pores having a size greater than 20 nm, or may be a step of forming a hydrogel type polymethacrylic acid thin film obtained by swelling polymethacrylic acid by moisture.

Preferably, the gate insulation layer and the organic passivation layer are formed so as to have a thickness of 100-1200 nm, respectively.

Alternatively, the step of forming the gate insulation layer and the organic passivation layer may be replaced by a step of forming a polymethacrylic acid thin film of a high density in which a molecular link is stable as hydrophilic groups of polymethacrylic acid which are hydrogen-bonded to each other.

As another alternative, the step of forming the gate insulation layer and the organic passivation layer may be replaced by a step of forming a thin film by sputtering. And, the sputtering method may be performed in a state having no additional heat, which may be called as a room temperature state.

Preferably, the step of forming a thin film is performed by sputtering, which will be explained in further detail.

Firstly, polymethyl-methacrylate powder (having a molecular amount of 350,000-Aldrich) is put inside a cylindrical container, and is melted in a chlorobenzene or toluene solvent. In order to vaporize the solvent, mechanical stirring is continuously performed at room temperature. When the mechanical stirring is performed at a high temperature, air bubbles may occur at the target during a solidification process. Accordingly, the processing temperature is not increased. After both surfaces of the solidified polymethylmethacrylate target are rubbed by a sandpaper to be flat, then a sputtering target with 2-inch was fabricated.

After preparing the sputtering target, a polymethacrylic acid thin film was fabricated by sputtering at room temperature. The process for fabricating the polymethacrylic acid thin film will be explained as follows.

The prepared target was made to undergo a sputtering process, thereby forming a polymethacrylic acid thin film having a thickness of 300 nm. Here, RF power of the sputtering was 10 W, and a process pressure was 10 mTorr. An inactive processing gas, in the form of pure Ar, was used to prevent an additional chemical reaction between a polymer and gas during a deposition process. Even though cooling water circulates on a rear surface of the target, the target may melt due to its increased temperature upon increasing the deposition power. Accordingly, the deposition process was performed in a state where the deposition power was lowered as much as possible.

A dielectric characteristic of the formed thin film was measured by an HP4192 impedance analyzer at a frequency of 100 kHz. And, a leakage current and breakdown characteristics of the formed thin film were measured by an HP 4145B semiconductor parameter analyzer. In order to evaluate an electric characteristic of the polymethacrylic acid thin film, a capacitor having a metal-insulator-metal (MIM) structure was fabricated. Pt serving as a lower electrode was deposited on Ti(30 nm)/SiO$_2$/Si to a thickness of 100 nm, and a polymethacrylic acid thin film having a thickness of 120-1150 nm was formed on the lower electrode. And, a round dot type of Pt, an upper electrode having a size of $3.14 \times 10^{-4}$ cm$^2$ was formed on the polymethacrylic acid thin film by using a shadow mask.

In order to compare the fabricated capacitor performances, a capacitor was fabricated including a polymethyl-methacrylate thin film formed by spin coating, not by sputtering. The polymethyl-methacrylate thin film was deposited on the substrate to a thickness of 300 nm. 5% by weight of polymethyl-methacrylate powder was dissolved in chlorobenzene, and was deposited by spin coating at 3,000 RPM for 30 seconds. Then, the resultant was heat-treated in a hot plate for 30 minutes at a temperature of 100° C. so as to evaporate the solvent inside the coated polymethyl-methacrylate thin film and so as to enhance a bonding force to the substrate.

FIG. 1 shows a dielectric constant of a derivative polymethyl-methacrylate (PMMA), a polymethacrylic acid thin film according to an applied voltage, the thin film deposited to a thickness of 300 nm by sputtering at room temperature. The polymethacrylic acid thin film deposited by sputtering exhibited a dielectric constant of 4.3, whereas a polymethacrylic acid thin film deposited by spin coating for comparison exhibited a dielectric constant of 4.1. All of the polymethacrylic acid thin films deposited by sputtering to thicknesses of 120, 320, 420 and 1150 nm exhibited a dielectric constant of 4.3 as a result of calculations through an equation of $C = \varepsilon_o \cdot \varepsilon_r \cdot A/d$ ($\varepsilon_o = 8.854 \times 10^{-12}$ F/m, $\varepsilon_r$ denotes a dielectric constant, 'A' denotes an area of an electrode, and 'd' denotes a thickness of a thin film), which is a little larger than the currently commercialized oxide silicon ($\varepsilon_r = 3.9$). This exhibited dielectric constant of 4.3 may be applied to a capacitor that can be directly fabricated on a plastic substrate, and a gate insulation layer of a transistor.

Figure 2:
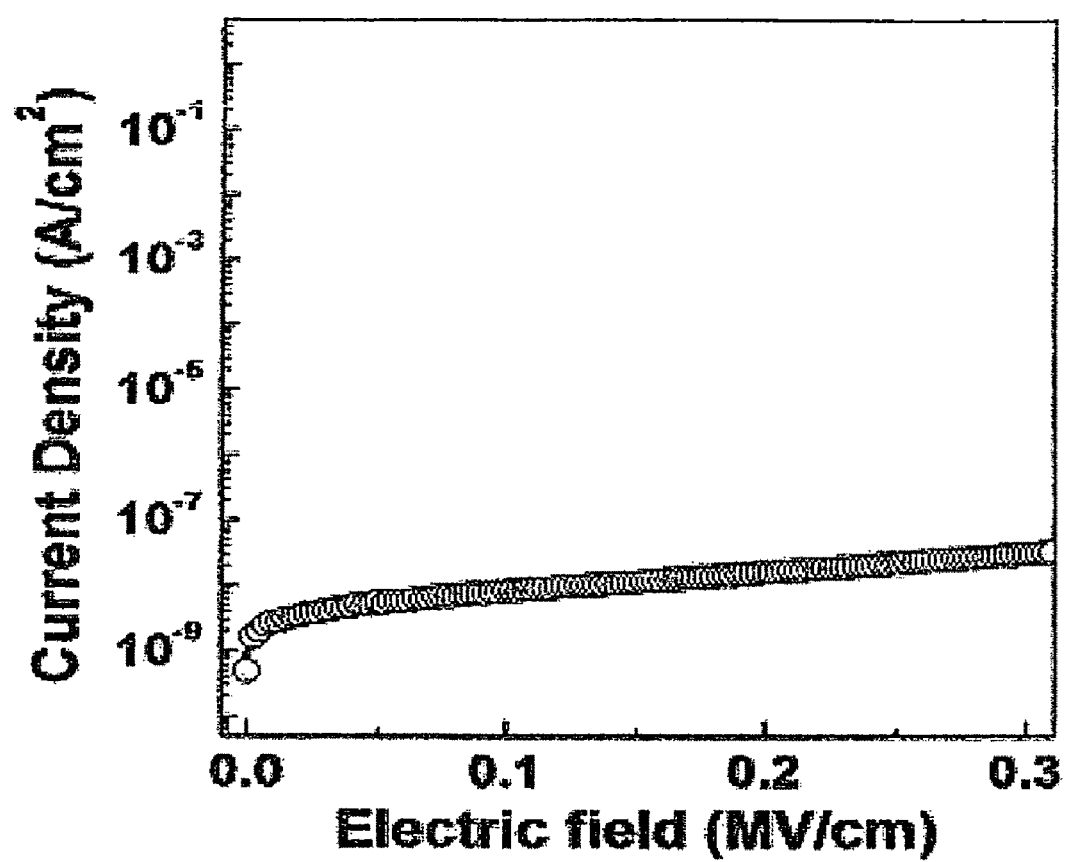
FIG. 2 is a graph showing the current density of a derivative polymethyl-methacrylate (polymethacrylic acid) thin film according to the present invention.

FIG. 2 is a graph showing a leakage current density of a derivative polymethyl-methacrylate (polymethacrylic acid) thin film deposited to a thickness of 300 nm by sputtering at room temperature according to the present invention.

When the derivative polymethyl-methacrylate (polymethacrylic acid) thin film has a thickness of less than 300 nm, the leakage current density exhibited a large value. Accordingly, an optimum thickness of the derivative polymethyl-methacrylate thin film was determined as 300 nm. The polymethyl-methacrylate thin film deposited by sputtering exhibited a leakage current density of $2 \times 10^{-8}$ A/cm$^2$ when an electric field was 0.3 MV/cm. On the other hand, the polymethyl-methacrylate thin film deposited by spin coating exhibited a leakage current density of $10^{-8}$ A/cm$^2$ when an electric field was 0.3 MV/cm. These results suggest that the polymethyl-methacrylate thin film deposited by sputtering exhibits a leakage current density higher than that of the polymethyl-methacrylate thin film deposited by spin coating. The reason is because a polymethacrylic acid thin film formed by sputtering has a density higher than that of a polymethyl-methacrylate thin film coated by a solution process.

Figure 3A:
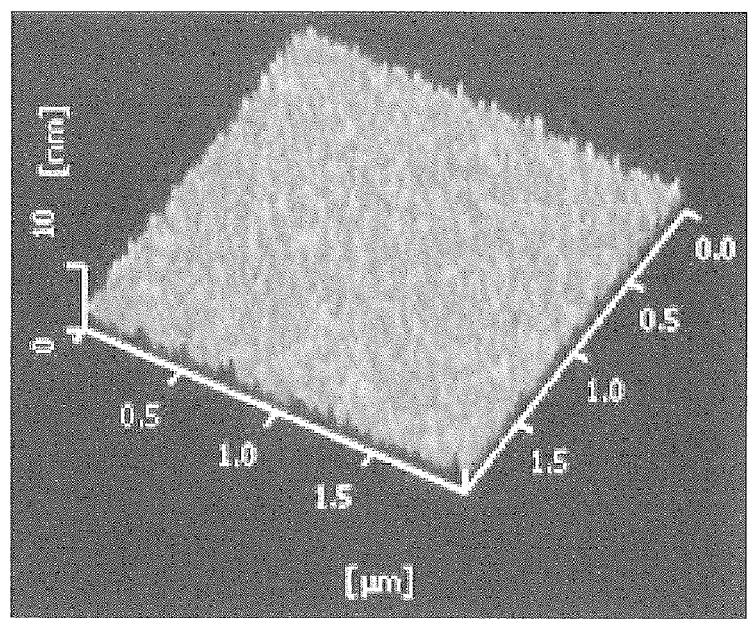
FIG. 3a shows the surface roughness of a derivative polymethyl-methacrylate (polymethacrylic acid) thin film deposited by sputtering according to the present invention.
Figure 3B:
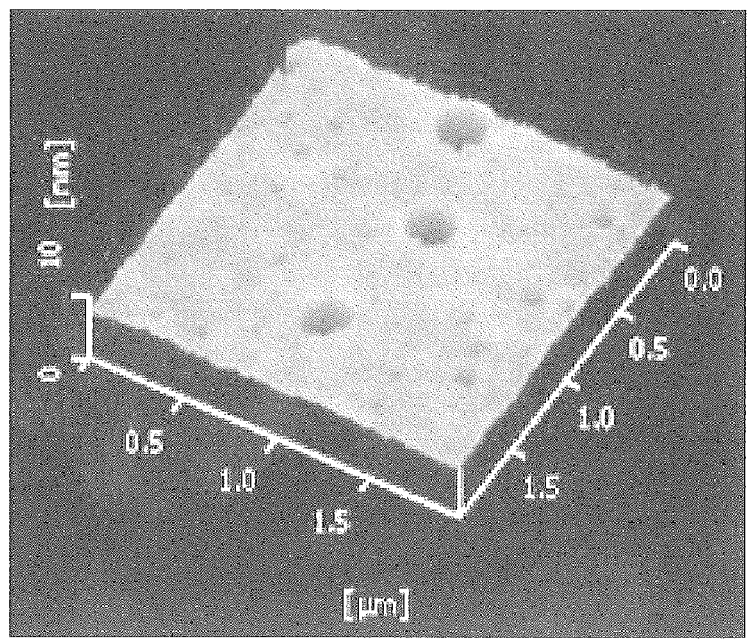
FIG. 3b shows the surface roughness of a derivative polymethyl-methacrylate (polymethacrylic acid) thin film deposited by spin coating in accordance with the conventional art.

FIG. 3a shows an image of a polymethacrylic acid thin film observed by an atomic force microscopy (AFM), the thin film deposited to a thickness of 300 nm by sputtering at room temperature. A root mean square (RMS) of a surface roughness of the thin film was 1.56 nm, which indicates that the thin film exhibited a density higher than that of the polymethyl-methacrylate thin film formed by spin coating (refer to FIG. 3b). The reason is because the polymethyl-methacrylate thin film formed by spin coating has a plurality of pin holes as shown in FIG. 3b. These pin holes are formed by a surface tension of a solution during a coating process, and are mainly formed during a heat treatment process for evaporating a solvent. These pin holes may also cause the thin film to have a high leakage current density.

Figures 4A, 4B:
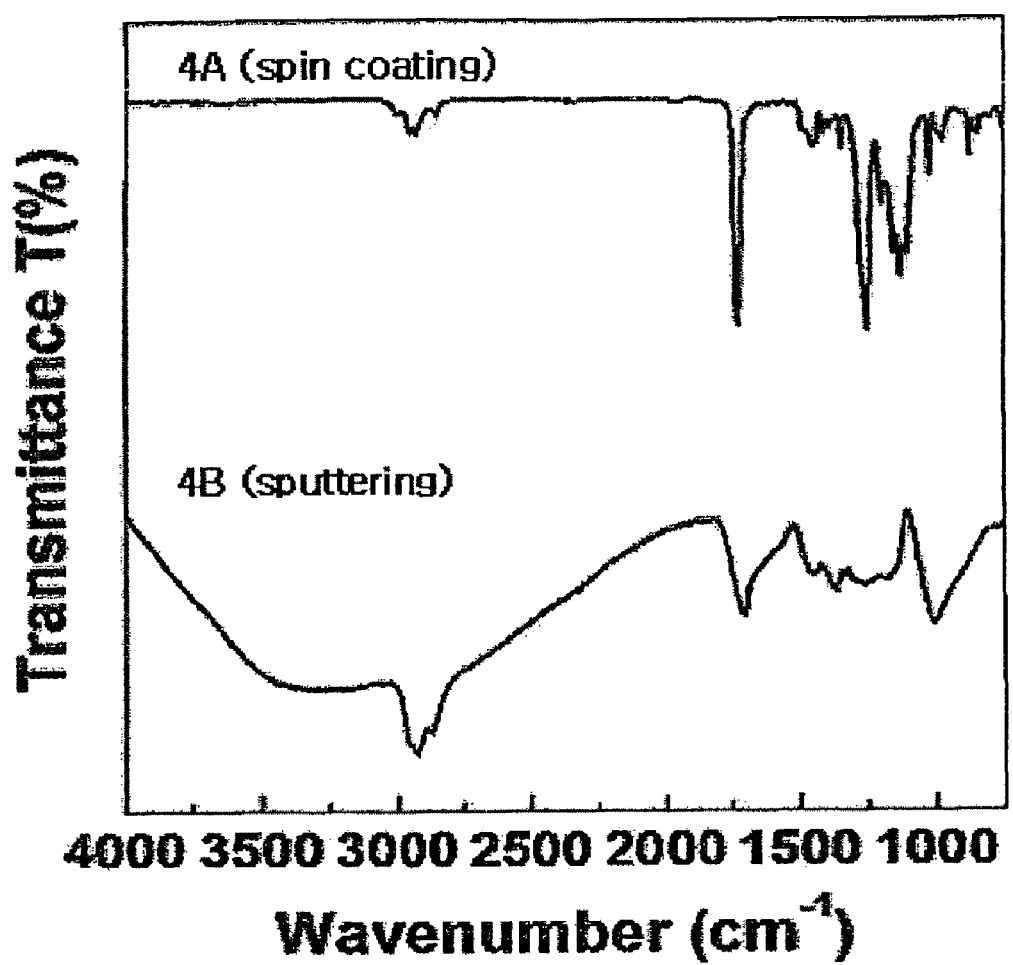
FIG. 4a is a graph showing the FT-IR spectrum of a derivative polymethyl-methacrylate (polymethacrylic acid) thin film deposited by spin coating in accordance with the conventional art.
FIG. 4b is a graph showing the FT-IR spectrum of a derivative polymethyl-methacrylate (polymethacrylic acid) thin film deposited by sputtering according to the present invention.

FIG. 4a is a graph showing an FT-IR spectrum of a derivative polymethyl-methacrylate (polymethacrylic acid) thin film deposited by spin coating in accordance with the conventional art; and FIG. 4b is a graph showing an FT-IR spectrum of a derivative polymethyl-methacrylate (polymethacrylic acid) thin film deposited by sputtering according to the present invention.

FIG. 4a refers to the conventional polymethacrylic acid thin film deposited by spin coating exhibiting peak values of 2976, 2952, 1727, 1436 and 1151 cm$^{-1}$ corresponding to CH$_2$, CH$_2$ contraction vibration, carbonyl of an ester group, C—CH$_3$, CH band vibration of an ester group and CH$_3$—O band vibration, respectively. On the other hand, the polymethacrylic acid thin film deposited by sputtering according to the present invention exhibited new peak values of 3264, 1716 and 1011 cm$^{-1}$ corresponding to an '—OH' group, a carbonyl group of carboxylic acid, and C—O contraction vibration, respectively. These results indicate that an ester bonding was cleaved during a sputtering process. The new peaks were generated because a sigma bonding between oxygen atoms and carbon atoms had been cleaved during a sputtering process, which indicates that the polymethacrylic acid thin film deposited by sputtering has a molecular structure different from that of the polymethacrylic acid thin film deposited by spin coating.

The generated derivative has an FT-IR characteristic peak similar to that of polyacrylic acid (C. J. Pouchert, *The Aldrich library of FT-IR spectra*, Vol. 2, p. 1182c, Adrich Chemical Company, Inc. (1985)). This suggests that the polymethyl-methacrylate, which was transformed into polymethacrylic acid as an ester bonding of branches thereof, was cleaved during a sputtering process. The experimental result of a contact angle of 72.8° was measured by using deionized water, as the polymethyl-methacrylate thin film was deposited by spin coating. In contrast, the polymethyl-methacrylate thin film deposited by sputtering exhibited a contact angle of 44.0°. This suggests that the thin film deposited by sputtering has greater hydrophilicity than that of the thin film deposited by spin coating. The high hydrophilicity of the thin film deposited by sputtering is considered to have resulted from branches of carboxylic acid groups (—COOH). Once branches of a polymer have a high polarity, a bonding characteristic to a substrate is enhanced. Since a functional group having high polarity undergoes a secondary bonding such as a hydrogen bonding to the peripheral molecules, a net-shaped polymer film having a high strength is formed. The polymethacrylic acid thin film deposited by sputtering has a high density, high hydrophilicity, and an enhanced leakage current characteristic.

Hereinafter, a method for fabricating a transistor by using a thin film formed by sputtering will be explained in more detail.

Firstly, a thin film transistor was fabricated by using a polymethacrylic acid thin film deposited by sputtering as a gate insulation layer for an oxide is semiconductor transistor. As a substrate, a polyethyleneterephehalate (PET) substrate was used. However, as the substrate of the present invention, a plastic substrate, a glass substrate or a silicon wafer having an insulation film deposited thereon, etc. may be used instead. In order to minimize the occurrence of pin holes and to uniformly deposit a gate insulation layer on an entire surface of the substrate, a thickness of the gate insulation layer was in the range of 100-1000 nm. Preferably, the thickness of the gate insulation layer was 300 nm. Since the PET substrate has a low glass transition temperature of 70-100° C., a transistor fabricated on the PET substrate preferably had a processing temperature less than the glass transition temperature of the PET substrate.

Figure 5:
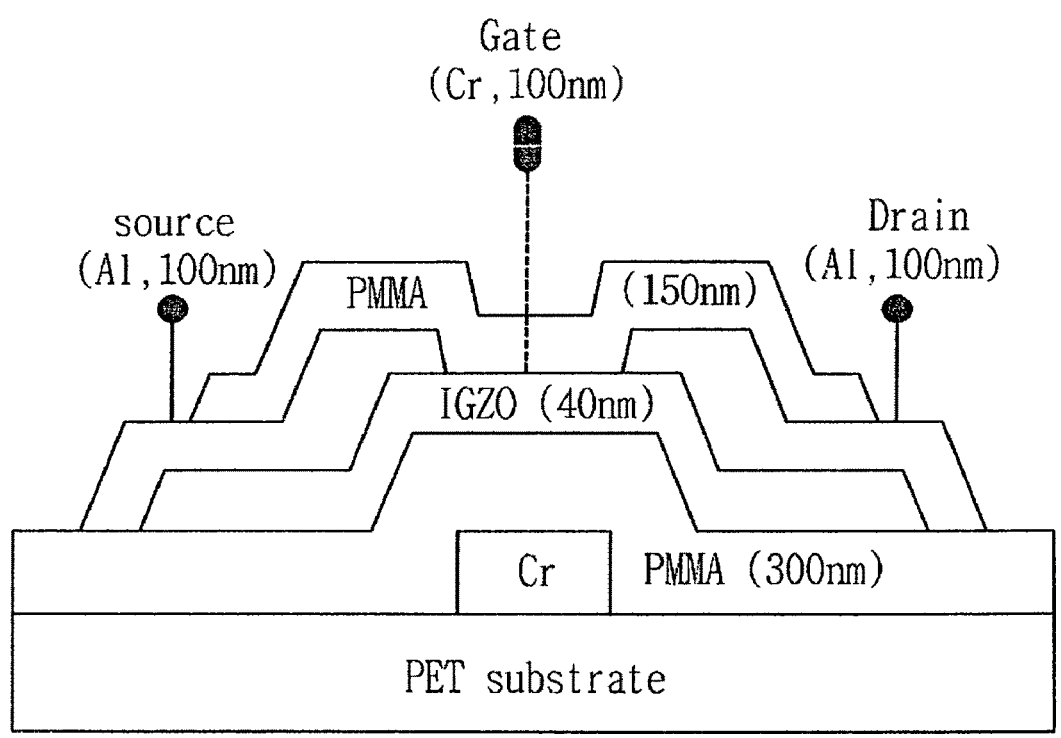
FIG. 5 is a view schematically showing the structure of a transistor according to the present invention.

FIG. 5 schematically shows a structure of a transistor according to the present invention. The transistor according to the present invention may have a lower gate structure or an upper gate structure. However, the present invention provides a transistor having a low gate structure with consideration of evaluation of characteristics of the gate insulation layer of polymethacrylic acid as one possible example.

Firstly, a gate electrode was deposited on the substrate to a thickness of 100 nm by evaporation or by sputtering. For the gate electrode, either Al, Au, Cr, ITO ($In_2O_3$ doped with $SnO_2$), Mo, Pt, etc. may be used. In the present invention, Cr was deposited by sputtering. Then, a polymethacrylic acid thin film was deposited on the gate electrode as a gate insulation layer by sputtering. Finally, aluminum (Al) source electrode and drain electrode were deposited by evaporation on the gate insulation layer, thereby fabricating a transistor. In the preferred embodiment, $InGaZnO_4$ was used as a channel layer, and the deposition was performed to a thickness of 40 nm by sputtering at room temperature under is conditions of 50 W of RF power, 60 mTorr of process pressure, and 5 sccm of Ar.

In this instance, the room temperature does not indicate a temperature of about 25° C., but indicates a temperature where additional heating process is not performed. The sputtering process includes spontaneous temperature increment. Here, a channel width and a channel length of the thin film transistor were 2000 μm, and 50-200 μm, respectively.

Figure 6:
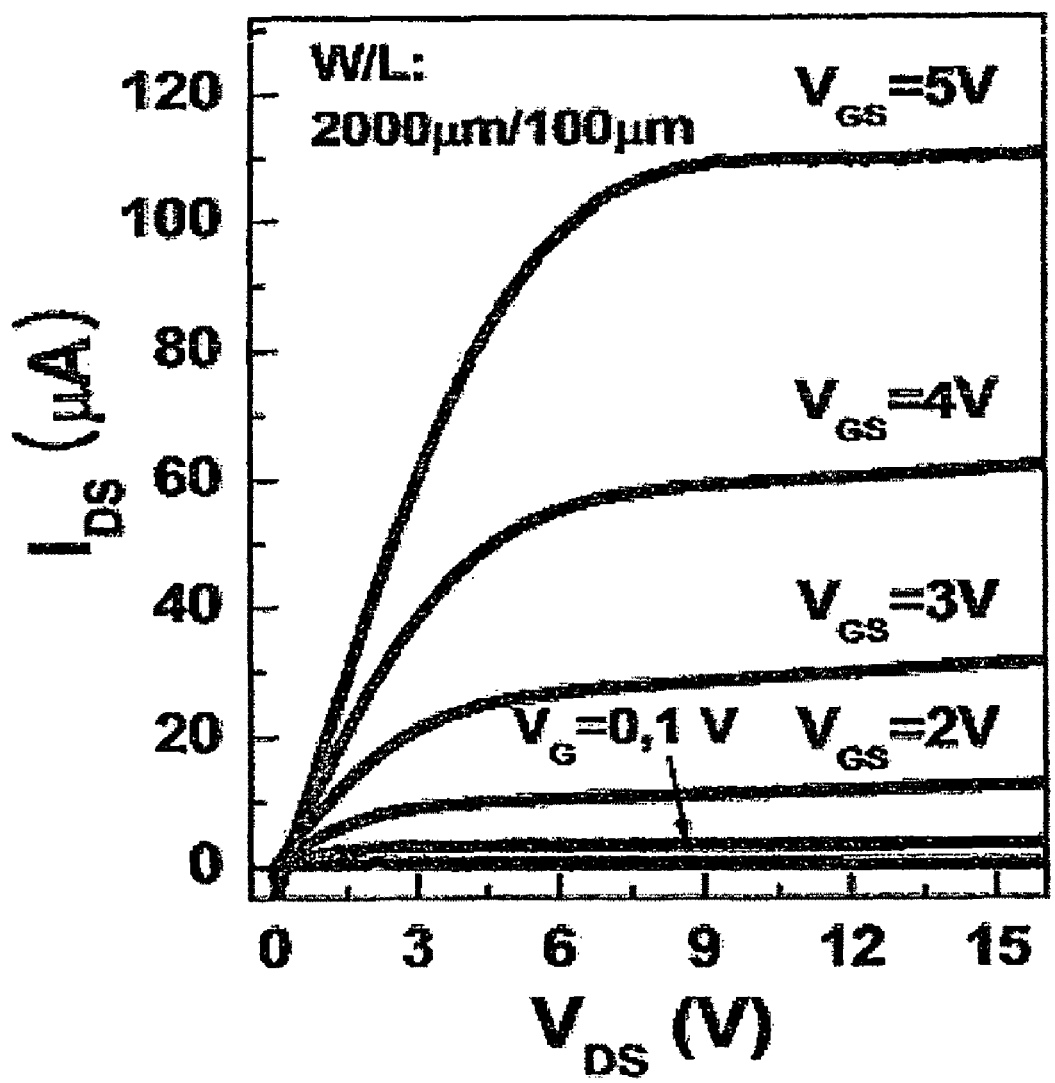
FIG. 6 is a graph showing the output characteristic of an oxide semiconductor-based transistor fabricated by using a derivative polymethyl-methacrylate (polymethacrylic acid) thin film as a gate insulation layer according to the present invention.

FIG. 6 is a graph showing an output characteristic of an oxide semiconductor-based transistor fabricated by using a polymethacrylic acid thin film, formed on a plastic PET by sputtering at room temperature as a gate insulation layer according to the present invention.

A polymethacrylic acid insulation film was fabricated to a thickness of 300 nm, and a semiconductor channel layer, $InGaZnO_4$ was fabricated to a thickness of 40 nm. A channel width and a channel length of the transistor were 2000 μm and 100 μm, respectively. When a gate voltage ($V_{GS}$) is 0 V, the transistor exhibited an 'OFF' characteristic. As the gate voltage ($V_{GS}$) is increased, a source and drain current ($I_{DS}$) was increased. When the gate voltage is 5 V, the source and drain current ($I_{DS}$) was very high at 110 μA.

Figure 7:
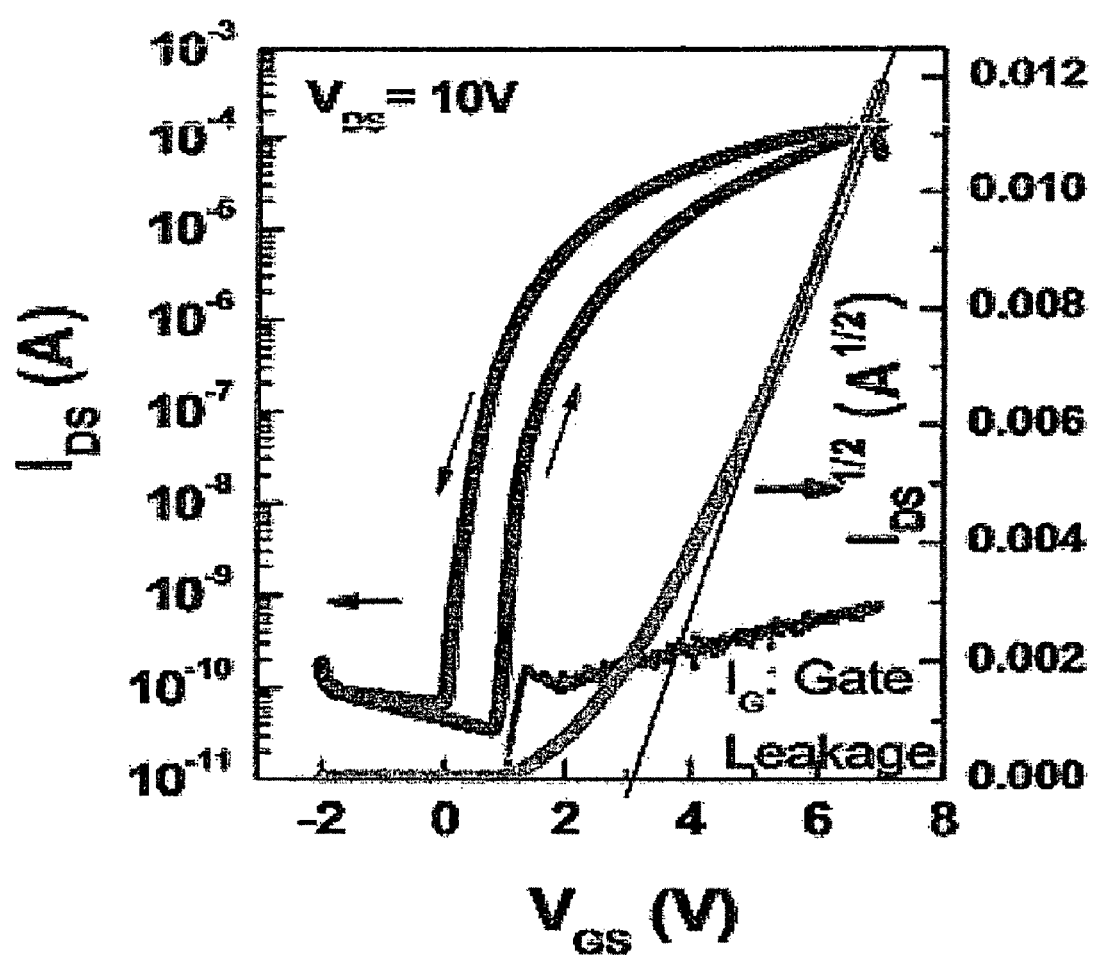
FIG. 7 is a graph showing the transfer characteristic of an oxide semiconductor-based transistor fabricated by using a derivative polymethyl-methacrylate (polymethacrylic acid) thin film as a gate insulation layer according to the present invention.

FIG. 7 is a graph showing a transfer characteristic of an oxide ($InGaZnO_4$) semiconductor-based transistor fabricated by using a polymethacrylic acid thin film, formed on a plastic PET by sputtering at room temperature as a gate insulation layer according to the present invention.

FIG. 7 shows a source and drain current characteristic according to changes of a gate voltage ($V_{GS}$) with $V_{DS}$ at 10 V.

The $InGaZnO_4$-based transistor fabricated on a PET substrate by using a polymethacrylic acid thin film as a gate insulation layer exhibited an ON current of $1.41 \times 10^{-4}$ A, an OFF current of $3.45 \times 10^{-11}$ A, and a high ON/OFF ratio of $4.08 \times 10^6$. The fabricated transistor exhibited a high field effect mobility of 36.1 $cm^2/V \cdot s$, and a threshold voltage ($V_{th}$) of 3.1 V. And, subthreshold swing (SS) was high at 220 mV/dec.

Hereinafter, a method for fabricating a transistor using a polymethacrylic acid thin film for providing stability to the transistor as a passivation layer will be explained in more detail.

A polymethacrylic acid thin film was deposited on the transistor to a thickness of 150 nm so as to be used as a passivation layer of the transistor.

Figure 8:
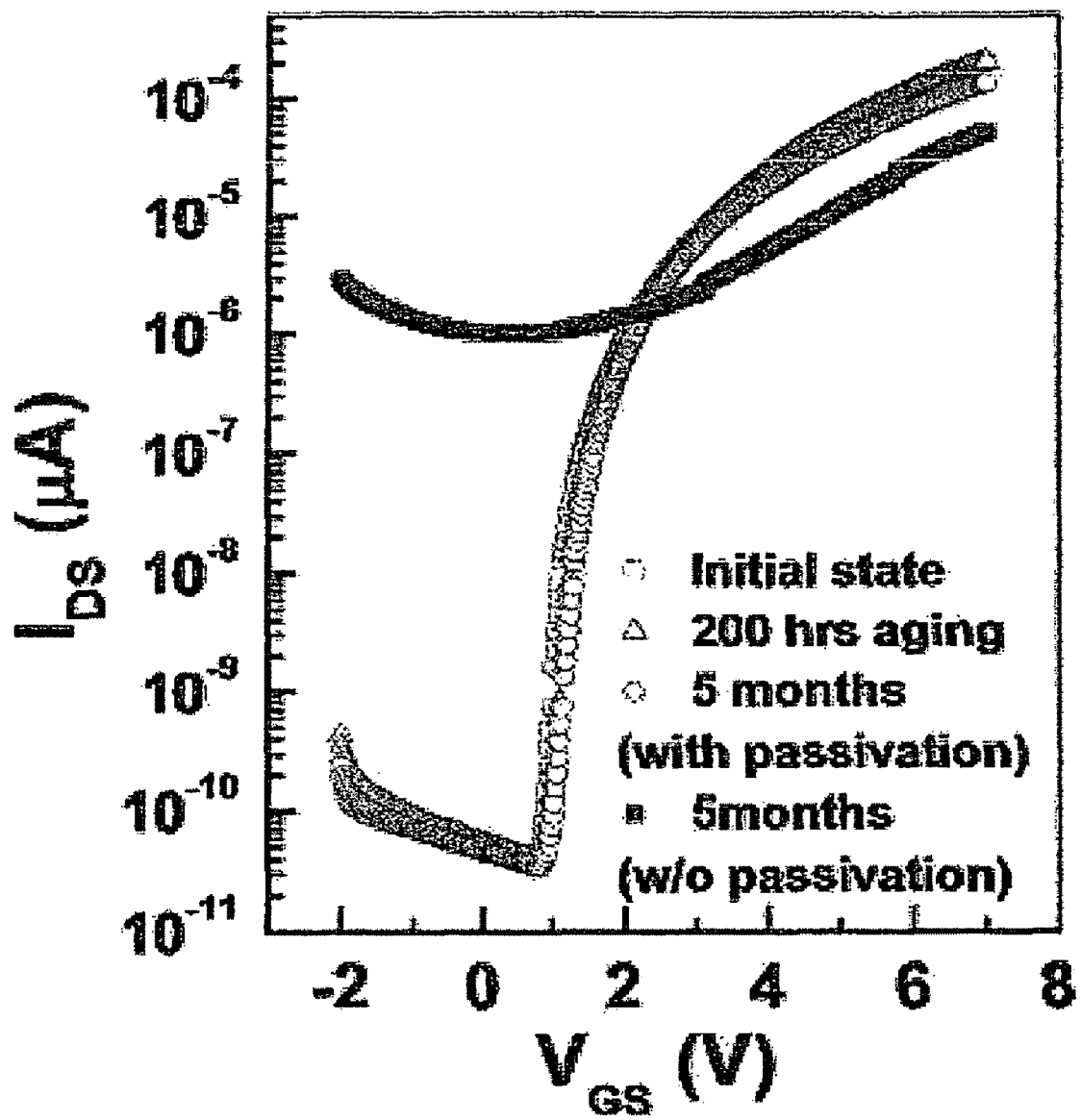
FIG. 8 is a graph showing changes of a transfer characteristic of an oxide semiconductor-based transistor according to time, and the transistor fabricated by is using a derivative polymethyl-methacrylate (polymethacrylic acid) thin film as a passivation layer according to the present invention.

FIG. 8 is a graph showing changes of a transfer characteristic of an oxide ($InGaZnO_4$) semiconductor-based transistor according to time, the transistor fabricated by using a polymethacrylic acid thin film as a passivation layer according to the present invention.

FIG. 8 shows a source and drain current characteristic according to changes of gate voltage ($V_{GS}$) with a $V_{DS}$ at 10 V.

Referring to FIG. 8, the transistor without a passivation exhibited a degeneracy phenomenon after 5 months, and did not implement its functions as a transistor. On the other hand, the transistor having a polymethacrylic acid thin film deposited thereon by sputtering as a passivation layer scarcely exhibited an electric characteristic changed after 200 hours or 5 months, because the deposited polymethacrylic acid thin film having a high density and enhanced uniformity was prevented from contacting moisture or oxygen, and thus lifespan of the transistor was prolonged.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A transistor, comprising:
  a substrate;
  a gate electrode formed on the substrate;
  a gate insulation layer including a polymethacrylic acid thin film formed on the gate electrode and the substrate;
  a channel layer formed on the gate insulation layer;
  a source electrode and a drain electrode formed on the channel layer so as to expose at least a part of the channel layer; and
  an organic passivation layer including a polymethacrylic acid thin film, formed on the source electrode, the drain electrode and the partially exposed channel layer,
  wherein the polymethacrylic acid thin films included in the gate insulation layer and the organic passivation layer are hydrogel type polymethacrylic acid thin films having high hydrophilicity with a contact angle of 45° or less, having a high density, and having no pores of a size greater than 20 nm.

2. The transistor of claim 1, wherein the gate insulation layer and the organic passivation layer include the polymethacrylic acid thin film having high hydrophilicity and which comprise polymethyl-methacrylate with branches having been transformed into carboxylic acid (—COOH) groups.

3. The transistor of claim 1, wherein the hydrogel type polymethacrylic acid thin film in the gate insulation layer and the organic passivation layer comprises a moisture swollen thin film.

4. The transistor of claim 1, wherein the gate insulation layer and the organic passivation layer have a thickness of 100-1200 nm, respectively.

5. The transistor of claim 1, wherein the gate insulation layer and the organic passivation layer include the polymethacrylic acid thin film having high density and no pin holes, and formed by sputtering as carboxylic acid (—COOH) groups of polymethacrylic acid are hydrogen-bonded to each other.

* * * * *